United States Patent [19]

Wu et al.

[11] Patent Number: 5,729,677
[45] Date of Patent: Mar. 17, 1998

[54] METHOD OF TESTING A CACHE TAG MEMORY ARRAY

[75] Inventors: Robert Han Wu, Austin; Jerome A. Gerner, Pflugerville; Richard A. Wheelus, Austin, all of Tex.

[73] Assignee: Motorola Inc., Schaumburg, Ill.

[21] Appl. No.: 509,549

[22] Filed: Jul. 31, 1995

[51] Int. Cl.$^6$ .................................................. G06F 11/22
[52] U.S. Cl. ................................. 395/183.18; 711/118
[58] Field of Search ..................... 395/183.01, 183.06, 395/183.18; 371/24, 25.1, 21.1, 21.2

[56] References Cited

U.S. PATENT DOCUMENTS

| | | | |
|---|---|---|---|
| 3,576,982 | 5/1971 | Duke | 395/182.04 |
| 4,740,971 | 4/1988 | Tam et al. | 371/10.3 |
| 4,926,314 | 5/1990 | Dhuey | 395/497.03 |
| 5,043,943 | 8/1991 | Crisp et al. | 365/189.01 |
| 5,195,096 | 3/1993 | Moore | 371/21.1 |
| 5,249,281 | 9/1993 | Fuccio et al. | 395/450 |

OTHER PUBLICATIONS

Dekker, et al.; "Fault Modeling and Test Algorithm Development for Static Random Access Memories;" 1988 IEEE Internat'l Test Conf.; Ch. 2610; Paper 20.1; pp. 343–352 (1988).

Dekker, et al.; "A Realistic Self–Test Machine for Static Random Access Memories;" 1988 IEEE Internat'l Test Conf.; Ch. 2610; Paper 20.2; pp. 353–361 (1988).

*Primary Examiner*—Eddie P. Chan
*Assistant Examiner*—Gary Portka
*Attorney, Agent, or Firm*—George R. Meyer

[57] ABSTRACT

Content testing (302–306) and comparator testing (312–326) of a tag section (24, 26) of a cache tag memory array is performed to confirm that the tag section (24, 26) is functional. For content testing (302–306), each tag location is tested once. Comparator testing (312–326) is performed to determine the functionality of the comparator (240, 260) of the cache tag memory array. The number of tests performed for the comparator testing is 2×M+2, where M is the number of bit positions in the tag location. Two of the tests are for testing the comparator's ability to identify correctly hits within the tag section (312–316). The other tests are for testing the comparator's ability to identify correctly misses within the tag section at each bit position of the tag locations (322–326).

16 Claims, 2 Drawing Sheets

METHOD OF TESTING A CACHE TAG MEMORY ARRAY

FIELD OF THE INVENTION

The present invention relates to testing memory arrays, and in particular, to testing tag sections of cache tag memory arrays.

BACKGROUND OF THE INVENTION

When memory devices are small, all possible combinations of data to be stored within the device can be tested. With larger memory arrays, testing all possible combinations in every bit location becomes virtually impossible. In an integrated cache random access memory (RAM) device, the number of possible combinations is equivalent to $2^M \times 2^M$, where M is the number of bit positions that identify a tag location. If M is 11, there are $2^{11} \times 2^{11}$ or about four million possible combinations. Performing four million tests takes a long time.

Methods have been devised to test a lesser number of combinations while still trying to maintain the integrity of the test. In a method called the march pattern, the number of tests that are performed is 6×N, where N is the number of address rows, and equals $2^M$. For 11 bit positions, the march pattern has about 12000 tests that are performed. Another method is the gallop pattern. For the gallop pattern, the number of tests that are performed is $N^2+N$. For 2000 address rows, over 4 million tests are performed.

A need exists for testing the tag section of a cache tag memory array without testing every possible data combination. The test needs to check the content of the tag section and each bit position within a comparator.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

Content testing and comparator testing of a tag section of a cache tag memory array are performed to confirm that the tag section is functional. For content testing, the data is written into tag locations where each datum has a value equivalent to its corresponding tag location. The data is compared to their corresponding tag locations to make sure that all hits or no misses are detected. As used in this specification, a test for all hits is looking for all hits or no misses, and a test for all misses is looking for all misses or no hits. For content testing, the number of tests is the same as the number of tag locations.

The comparator is tested for its ability to detect accurately hits or misses. The first two tests test the comparator's ability to detect hits at all bit positions simultaneously. The first datum for one of these could use all ones or all zeros, and the second datum would be the other. The first and second data are written into tag locations having an equivalent value. The data is compared to their tag locations to make sure that all hits are detected.

The next set of tests test the comparator for its ability to detect misses. For each bit position, two tests are performed for the two different states of data ("0" and "1"). Each datum and its corresponding tag location are identical other than the specific bit position being tested. The data is compared to their tag locations to make sure that all misses and no hits are detected. For comparator testing, the number of tests is 2×M+2, where M is the number of bit positions used for addresses in each tag location.

Addresses and tag locations are distinguished to aid understanding the relationship between them. A tag section (also called a "tag cache") has addresses that generally correspond to rows or columns depending on the layout of the cache tag memory array. Each address has several bit positions, of which, some bit positions are reserved for status, bursting, or the like. The other bit positions are reserved for the "tag" within the tag section. These other bit positions are essentially an address within an address. To reduce confusion, these other bit positions of each address are referred to as a "tag location." The tag locations are portions of the addresses that are used for identification, not for status, bursting, or the like.

Different states can be used with the present invention. For the embodiments below, ones and zeros are used. Alternatively, highs and lows or trues and falses could be used. One, high, and true are opposite states from zero, low, and false, respectively.

Cache Tag Memory and Its Testing

Figure 1:
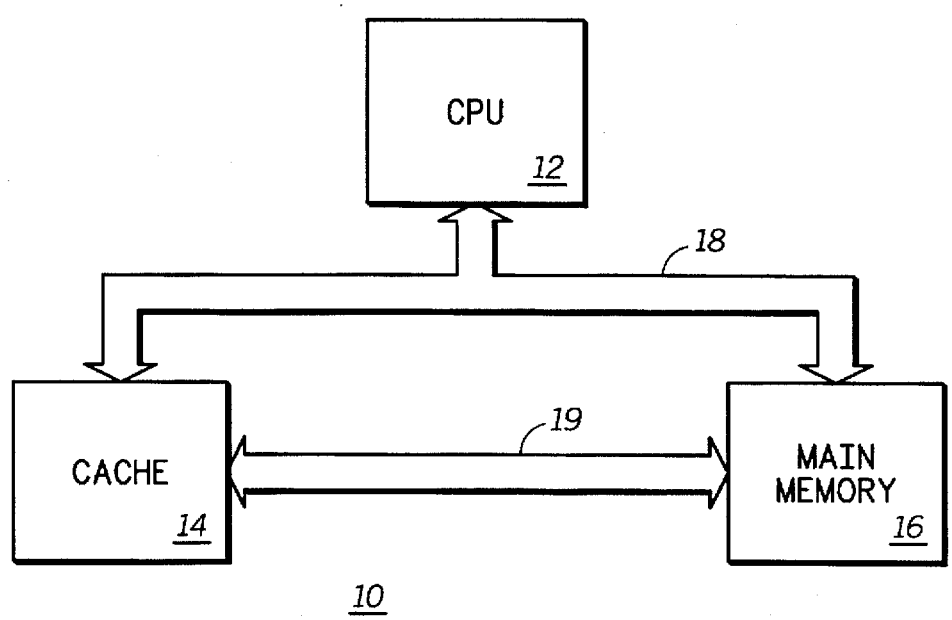
FIG. 1 includes a schematic diagram of a data processing system.

FIG. 1 includes a schematic diagram of a data processing system 10. The data processing system includes a central processing unit (CPU) 12, a cache device 14, and a main memory 16. The CPU 12 is coupled to the cache device 14 and main memory 16 by bus 18. In FIG. 1, the cache device 14 is coupled to the main memory 16 directly. In other embodiments, the cache device 14 is coupled to the main memory 16 through CPU 12. The main memory 16 includes a dynamic random access memory (DRAM), a hard disk, a compact disk read-only memory (CD ROM), or the like. The data processing system 10 in FIG. 1 is a simplified drawing and may be part of a computer system having other components including a keyboard, monitor, etc. that are not shown in FIG. 1. The buses 18 and 19 may include one or more buses but are illustrated as single buses for simplicity.

Figure 2:
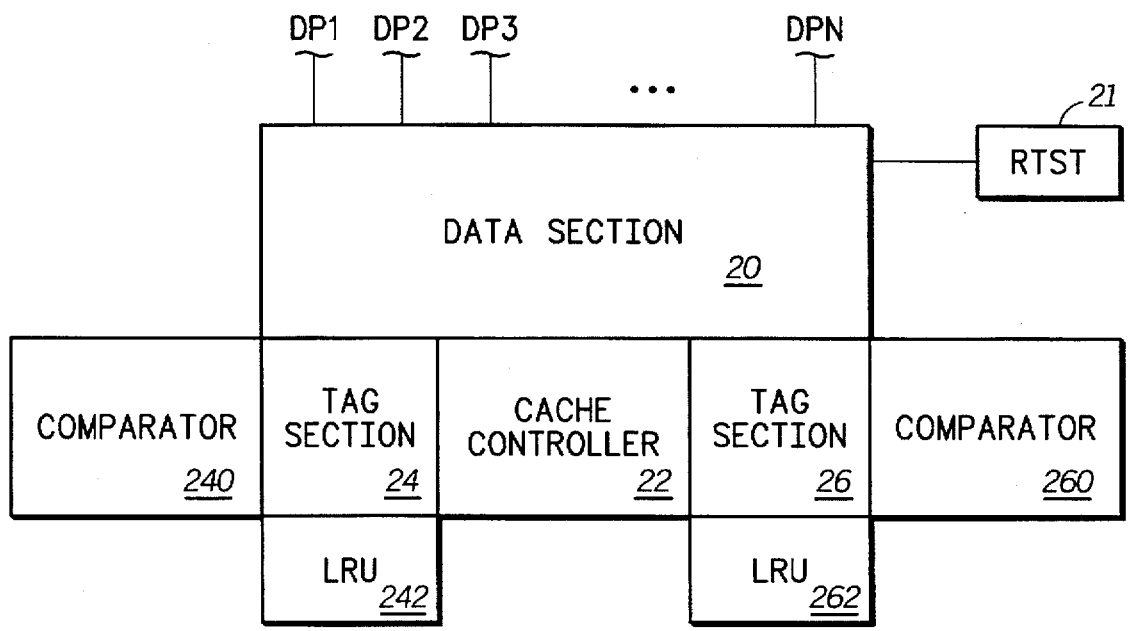
FIG. 2 includes a schematic diagram of the cache device within the data processing system.

FIG. 2 includes a schematic diagram of the cache device 14, such as an integrated cache RAM device. In this particular embodiment, data ports DP1, DP2, DP3, . . . , DPN are data ports for the cache device 14 that are coupled to the data section 20 of the cache device 14. The data ports allow data to be directly stored into the data section 20 and are controlled by the cache controller 22. The addresses (called tags) of those data are stored in the tag section for future access. The memory device has two tag sections 24 and 26. Under normal operating conditions (not testing), access to the tag sections 24 and 26 is controlled by the cache controller 22, and the data ports are not directly connected to the tag sections 24 and 26.

The cache device 14 further includes comparators 240 and 260 that compare a tag within the tag sections 24 and 26 to its associated tag in the data section 20. The device 14 also has least recently used (LRU) modules 242 and 262. LRU modules are typically used for set associative cache tag devices. These modules allow the memory device 14 to write over the least recently used tag within a set. In one example, a four set associative memory device is used and has four possible addresses. The LRUs will check which of the four addresses went the longest before it was last used relative to the other three in the set. New data is written into that location. The comparator 240 and LRU 242 may be considered part of the tag section 24 because comparator 240 and LRU 242 are used for tag section 24 and not tag section 26. A similar relationship holds for the tag section 26, comparator 260, and LRU 262.

The cache device 14 has a special pin RTST 21 that is used during the testing of the device. When activated, the pin allows data from the data ports to bypass the data cache and be directly written to the tag sections 24 and 26.

In a specific embodiment of FIG. 2, the data section 20 has 32 K×36 bits of data, each of the tag sections 24 and 26 has 4 K×19 bits of data, and the LRUs 242 and 262 have 2 K×4 bits of data. Each address is 19 bits long within the tag sections 24 and 26. Three bit positions are reserved for the status information, and five bit positions are reserved for bursting information. The other eleven data bit positions are used for the tag location. Other embodiments are possible, but for the purposes of illustration, this embodiment allows an easier comparison to the methods described in the background section.

Attention is now directed to testing of the tag sections and comparators of the cache device 14. The test focuses on the tag locations. Therefore, the test is directed to the eleven bit positions that are used in the tag locations. The testing tests the tag sections 24 and 26 for content and tests the comparators 240 and 260 for its ability to detect correctly hits and misses at all bit positions.

Figure 3:
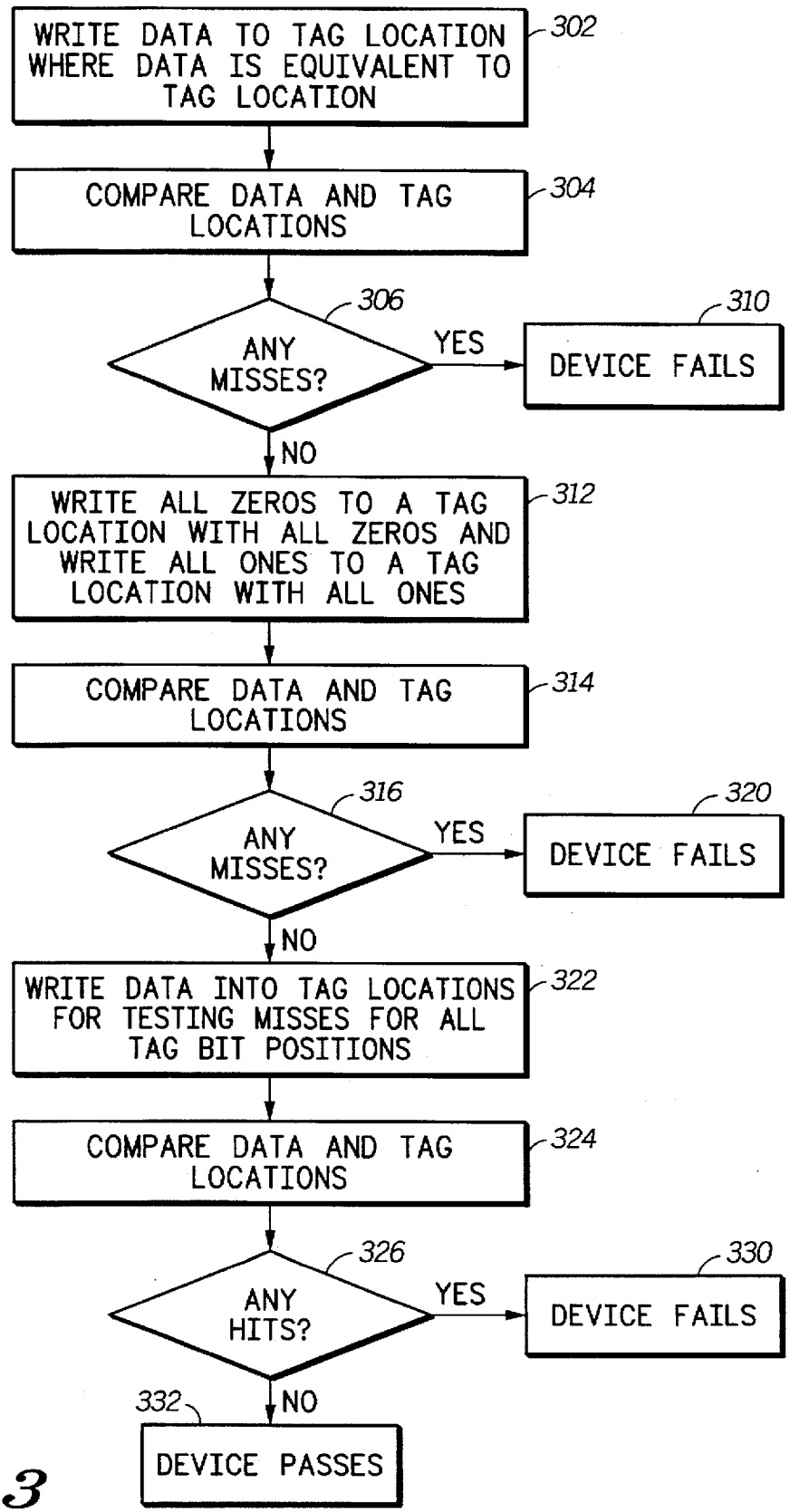
FIG. 3 includes a process flow diagram of a method of testing the cache device of the data processing system in accordance with an embodiment of the present invention.

FIG. 3 includes a process flow diagram of a test method used according to the present invention. Data is written to tag locations where the data for that tag location is equivalent to its corresponding tag location as shown in step 302. The data is then compared to their corresponding tag locations (step 304). At this point, if the device is working properly there should be all hits and no misses. Therefore, if any misses are detected (306), the device fails (step 310). Otherwise, the device passes, and testing continues. This portion of the testing is performed to test the content of the tag sections 24 and 26. The number of tests equals $2^M$, where M is the number of bit positions for the tag locations. In this embodiment, $2^{11}$ or 2048 tests are performed for the content testing.

The rest of the testing is performed to test the comparators 240 and 260. The first two tests are used to test all bit positions of the comparator for hits when all zeros and all ones are used. The other tests are performed to test each bit position within the comparator to make sure it can detect a miss at any bit position. The comparator testing uses 2×M+2 tests. In this embodiment, 24 tests are performed for the comparator testing.

Referring to FIG. 3, all zeros are written to a tag location having all zeros and all ones are written to a tag location that has all ones (step 312). When eleven bit positions are used for the tag location, only the eleven bit positions for the tag location have all ones or all zeros. It does not require all nineteen bit positions to have all ones or all zeros. The tag locations where all zeros or all ones were written are compared to their data (step 314). If the device is working properly there should be all hits. Therefore, if any misses are detected (316), the device fails (step 320). Otherwise, the device passes, and testing continues.

Steps 322-332 test each bit position to ensure that the comparators 240 and 260 can detect a miss at any bit position. For each bit position, there are two possible combinations of ones and zeros that will give a miss. Therefore, two tests are performed for each bit position. The data is written into the tag locations (step 322). The data is compared to its corresponding tag location (step 324). If the device is working properly, there should be all misses. Therefore, if any hits are detected (326), the device fails (step 330). Otherwise, the device passes, and testing of the tag section is completed (step 332). The other tag section of cache device 14 is then tested using the same method. When testing is completed, RTST 21 is deactivated, and the device returns to its normal operating mode.

When content testing and comparator testing in FIG. 3 are performed, the total number of tests for the embodiment is 2072 tests. Steps 312-320 may have been performed with the content testing if the comparator was used during the content testing. In this case, two fewer tests need to be performed. Only 2070 tests need to be performed to test each tag section. Compare this with the methods described in the background section that require almost six times as many tests. Clearly, the methods of the present invention are faster.

Examples are given below that have a fair amount of detail for performing the comparator testing, but those skilled in the art appreciate that the present invention is not limited by the following embodiments. In a first example, assume that the tag locations use eleven bit positions and no more can be used by the comparator. Table 1 includes information for performing the comparator testing.

TABLE 1

| Counter | Test | Tag Location | Data | Output |
|---|---|---|---|---|
| N + 1 | N + 1 | 000 0000 0000 | 000 0000 0000 | hit |
| N + 2 | N + 2 | 111 1111 1111 | 111 1111 1111 | hit |
| 1 | 1 | 000 0000 0011 | 000 0000 0010 | miss |
|   | 2 | 000 0000 0100 | 000 0000 0101 | miss |
| 2 | 3 | 000 0000 0111 | 000 0000 0101 | miss |
|   | 4 | 000 0000 1000 | 000 0000 1010 | miss |
| 3 | 5 | 000 0000 1111 | 000 0000 1011 | miss |
|   | 6 | 000 0001 0000 | 000 0001 0100 | miss |
| 4 | 7 | 000 0001 1111 | 000 0001 0111 | miss |
|   | 8 | 000 0010 0000 | 000 0010 1000 | miss |
| 5 | 9 | 000 0011 1111 | 000 0010 1111 | miss |
|   | 10 | 000 0100 0000 | 000 0101 0000 | miss |
| 6 | 11 | 000 0111 1111 | 000 0101 1111 | miss |
|   | 12 | 000 1000 0000 | 000 1010 0000 | miss |
| 7 | 13 | 000 1111 1111 | 000 1011 1111 | miss |
|   | 14 | 001 0000 0000 | 001 0100 0000 | miss |
| 8 | 15 | 001 1111 1111 | 001 0111 1111 | miss |
|   | 16 | 010 0000 0000 | 010 1000 0000 | miss |
| 9 | 17 | 011 1111 1111 | 010 1111 1111 | miss |
|   | 18 | 100 0000 0000 | 101 0000 0000 | miss |
| 10 | 19 | 111 1111 1111 | 101 1111 1111 | miss |
|   | 20 | 000 0000 0000 | 010 0000 0000 | miss |
| 11 | 21 | 111 1111 1111 | 011 1111 1111 | miss |
|   | 22 | 000 0000 0000 | 100 0000 0000 | miss |

In Table 1, Test N+1 and Test N+2 are the all zeros and all ones tests, respectively, that correspond to steps 312-316 in FIG. 3. The data for these two tests are written and then compared. The output of the comparator should be all hits and no misses.

In other embodiments, the "all zeros and all ones" test can be replaced by first and second data where each bit position of the second datum is opposite the same bit position of the first datum. In one example, the first datum is "111 1111

0000" and the second datum is "000 0000 1111." The first datum is written into a first tag location where the first datum has a value equivalent to first tag location. Note that the most significant bit position of the first data is a 1 and the most significant bit position of the second data is the opposite state, which is a 0. The "opposite states" relationship holds true for all other bit positions. The second datum is written into a second tag location where the second datum has a value equivalent to second tag location. This alternative for the "all zeros and all ones" test can be used in any of the embodiments discussed herein.

Tests 1–20 are then performed. The Counter is the bit position of the tag location that is being tested starting with the least significant bit position. In the odd numbered tests, the tag location of bit position being tested is a one, and the data is the same except that the bit position being tested is a zero. In the even numbered tests, the tag location of bit position being tested is a zero, and the data is the same except that the bit position being tested is a one. For Tests 1–19, the tag locations and data for the odd numbered tests are:

$$TL_{odd} = 2^{(X+1)} - 1$$

$$D_{odd} = 2^{(X+1)} - (2^{(X-1)} + 1)$$

where $TL_{odd}$ is the tag location;

$D_{odd}$ is the datum; and

X is the bit position being tested.

For Tests 1–19, the tag locations and data for the even numbered tests are:

$$TL_{even} = 2^{(X+1)}$$

$$D_{even} = 2^{(X+1)} + 2^{(X-1)}$$

where $TL_{even}$ is the tag location;

$D_{even}$ is the datum; and

X is the bit position being tested.

The tag locations and data from the above formulas are decimal numbers (base 10) that would be converted to binary format (base 2). For Test 20, the address has all zeros and its data has all zeros except for the second most significant bit position, which is a one.

Tests 21 and 22 are performed for the most significant bit position. For Test 21, the tag location has all ones and the data has all ones other than the most significant bit position that is a zero. For Test 22, the tag location has all zeros and the data has all zeros other than the most significant bit position that is a one.

Tests 1–22 correspond to steps 322–332 of FIG. 3. The data for Tests 1–20 are written and then compared. The output of the comparator should be all misses. The data for Tests 21 and 22 are written and then compared. The output of the comparator should be all misses.

In the example of Table 1, three sets of writes and three sets of reads are performed (opposed to one set of writing all information and then one set of reading all information) because Tests N+1, 20, and 22 have tag locations with all zeros and Tests N+2, 19, and 21 have tag locations with all zeros.

Another example appears in Table 2. This example assumes that additional bit positions are used for the comparator testing. Although the tag locations use 11 bit positions in normal operation, up to 13 bit positions are used for the comparator testing. The two extra bit positions are used for only some of the tests. In this example, the 11 or 13 bit positions being tested are still referred to as "Tag Location" because some of the tag locations for this test are 13 bits long instead of 11 bits long.

TABLE 2

| Counter | Test | Tag Location | Data | Output |
|---|---|---|---|---|
| N + 1 | N + 1 | 00 000 0000 0000 | 00 000 0000 0000 | hit |
| N + 2 | N + 2 | 11 111 1111 1111 | 11 111 1111 1111 | hit |
| 1 | 1 | 000 0000 0011 | 000 0000 0010 | miss |
|   | 2 | 000 0000 0100 | 000 0000 0101 | miss |
| 2 | 3 | 000 0000 0111 | 000 0000 0101 | miss |
|   | 4 | 000 0000 1000 | 000 0000 1010 | miss |
| 3 | 5 | 000 0000 1111 | 000 0000 1011 | miss |
|   | 6 | 000 0001 0000 | 000 0001 0100 | miss |
| 4 | 7 | 000 0001 1111 | 000 0001 0111 | miss |
|   | 8 | 000 0010 0000 | 000 0010 1000 | miss |
| 5 | 9 | 000 0011 1111 | 000 0010 1111 | miss |
|   | 10 | 000 0100 0000 | 000 0101 0000 | miss |
| 6 | 11 | 000 0111 1111 | 000 0101 1111 | miss |
|   | 12 | 000 1000 0000 | 000 1010 0000 | miss |
| 7 | 13 | 000 1111 1111 | 000 1011 1111 | miss |
|   | 14 | 001 0000 0000 | 001 0100 0000 | miss |
| 8 | 15 | 001 1111 1111 | 001 0111 1111 | miss |
|   | 16 | 010 0000 0000 | 010 1000 0000 | miss |
| 9 | 17 | 011 1111 1111 | 010 1111 1111 | miss |
|   | 18 | 100 0000 0000 | 101 0000 0000 | miss |
| 10 | 19 | 00 111 1111 1111 | 00 101 1111 1111 | miss |
|   | 20 | 01 000 0000 0000 | 01 010 0000 0000 | miss |
| 11 | 21 | 01 111 1111 1111 | 01 011 1111 1111 | miss |
|   | 22 | 10 000 0000 0000 | 10 100 0000 0000 | miss |

Other than the data in the two extra bit positions for Tests N+1, N+2, and 19–22, the data and tag locations for Tables 1 and 2 are the same. Tests N+1 and N+2 are still the all zeros and all ones tests, respectively. For Tests 19–22, the tag locations and data for the odd numbered tests are:

$$TL_{odd} = 2^{(Y+1)} - 1$$

$$D_{odd} = 2^{(Y+1)} - (2^{(Y-1)} + 1)$$

where $TL_{odd}$ is the tag location;

$D_{odd}$ is the datum; and

Y is the bit position being tested.

For Tests 19–22, the tag locations and data for the even numbered tests are:

$$TL_{even} = 2^{(Y+1)}$$

$$D_{even} = 2^{(Y+1)} + 2^{(X-1)}$$

where $TL_{even}$ is the tag location;

$D_{even}$ is the datum; and

Y is the bit position being tested.

The tag locations and data from the above formulas are decimal numbers (base 10) that would be converted to binary format (base 2).

One set of writes and one set of compares are performed because a unique tag location is used for each piece of data. The comparator testing corresponding to Table 2 should be quicker than comparator testing corresponding to Table 1 because there is no alternating between writing and comparing.

Benefits

The method of testing the tag sections and its comparators of the integrated cache RAM device allows thorough testing of the device to ensure its proper operation while having to perform a relatively low number of tests. In the example given above, each tag section 24 or 26 requires 2070 or 2072 tests. Other methods need 12,000 to four million tests per tag section. Fewer tests mean that the devices can be produced faster and cheaper.

The method of testing used is thorough enough to ensure that a bad device should be detected. The content testing tests each of the addresses once. Comparator testing tests the comparator for hits when the bit positions have zeros and when those bit positions have ones. Also, the comparator is tested for misses by examining one bit position at a time for combinations of ones and zeros. This testing should be sufficient to determine whether the tag section and its comparator of the cache tag memory array operates properly.

In the foregoing specification, the invention has been described with reference to specific embodiments thereof. However, it will be evident that various modifications and changes can be made thereto without departing from the scope of the invention as set forth in the appended claims. Accordingly, the specification and figures are to be regarded in an illustrative rather than a restrictive sense,

We claim:

1. A method of testing a comparator of a cache tag memory array having a tag section that has tag locations that include a plurality of bit positions, the method comprising the steps of:

writing a first datum into a first tag location and a second datum into a second tag location within the tag section, wherein:
the first datum has a value equivalent to the first tag location;
the second datum has a value equivalent to the second tag location; and
each bit position of the second datum has an opposite state of a same bit position of the first datum;

writing data into tag locations within the tag section, wherein:
a third datum is mitten into a third tag location and a fourth datum is written into a fourth tag location;
for a first particular bit position of the third and fourth data and tag locations:
the first particular bit position of the third tag location has a first state;
the first particular bit position of the third datum has a second state that is opposite the first state;
the first particular bit position of the fourth tag location has the second state; and
the first particular bit position of the fourth datum has the first state; and
for a second particular bit position of the third and fourth data and tag locations:
the second particular bit position of the third tag location and the second particular bit position of the third datum have a same state; and
the second particular bit position of the fourth tag location and the second particular bit position of the fourth datum have a same state; and for each tag location in which datum is written during the steps of writing, comparing each of the data to its corresponding tag location:
to confirm that hits are detected for the first and second tag locations; and
to confirm that misses are detected for the third and fourth tag locations.

2. The method of claim 1, wherein:
the cache tag memory array is part of an integrated cache RAM device; and
the method further comprises a step of inputting the first, second, third, and fourth data through a plurality of data ports of the integrated cache RAM device.

3. The method of claim 2, wherein:
the integrated cache RAM device has a cache controller; and
the method further comprises a step of bypassing the cache controller before the step of writing.

4. The method of claim 1, wherein the first datum has zeros in all of its bit positions and the second datum has ones in all of its bit positions.

5. The method of claim 1, wherein X is an integer and is the particular bit position having third and fourth tag locations and data as follows:
the third tag location is $2^{(X+1)}-1$;
the third datum is $2^{(X+1)}-(2^{(X-1)}+1)$;
the fourth tag location is $2^{(X+1)}$; and
the fourth datum is $2^{(X+1)}+2^{(X-1)}$.

6. The method of claim 1, wherein:
the plurality of bit positions includes N bit positions to be tested; and
the step of comparing is performed such that a total number of comparisons is at most 2N+2.

7. The method of claim 1, wherein the steps of writing and comparing are essentially the only steps of the method.

8. The method of claim 1, wherein:
except for the first particular bit position, each of the N bit positions of the third tag location has a same state as each of its corresponding bit position of the third datum; and
except for the first particular bit position, each of the N bit positions of the fourth tag location has a same state as each of its corresponding bit position of the fourth datum.

9. A method of testing a comparator of a cache tag memory array having a tag section that has tag locations that include a plurality of bit positions, the method comprising the steps of:

writing a first datum into a first tag location and a second datum into a second tag location within the tag section, wherein:
the first datum has a value equivalent to the first tag location;
the second datum has a value equivalent to the second tag location; and
each bit position of the second datum has an opposite state of a same bit position of the first datum;

comparing:
the first datum to the first tag location to confirm that a hit is detected; and
the second datum to the second tag location to confirm that a hit is detected;

writing third data into third tag locations and fourth data into fourth tag locations within the tag section, wherein:
for each bit position except for a most significant bit position, one of the third data and one of the fourth data are written;
for a first particular bit position of the third and fourth data and tag locations:
the first particular bit position of the third tag location has a first state;

the first particular bit position of the third datum has a second state that is opposite the first state;

the first particular bit position of the fourth tag location has the second state; and the first particular bit position of the fourth datum has the first state; and for a second particular bit position of the third and fourth data and tag locations:

the second particular bit position of the third tag location and the second particular bit position of the third datum have a same state; and the second particular bit position of the fourth tag location and the second particular bit position of the fourth datum have a same state; and for each of the third and fourth tag locations in which data is written during the step of writing, comparing the third data to their corresponding third tag locations to confirm that misses are detected, and comparing the fourth data to their corresponding fourth tag locations to confirm that misses are detected;

writing a fifth datum into a fifth tag location and a sixth datum into a sixth tag location within the tag section, wherein:

the most significant bit position of the fifth tag location has a third state;

the most significant bit position of the fifth datum has a fourth state that is opposite the third state;

the most significant bit position of the sixth tag location has the fourth state; and the most significant bit position of the sixth datum has the third state; and comparing the fifth datum to the fifth tag location and the sixth datum to the sixth tag location to confirm that misses are detected.

10. The method of claim 9, wherein:

the cache tag memory array is part of an integrated cache RAM device; and the method further comprises a step of inputting the first, second, third, fourth, fifth, and sixth data through a plurality of data ports of the integrated cache RAM device.

11. The method of claim 10, wherein:

the integrated cache RAM device has a cache controller; and the method further comprises a step of bypassing the cache controller before the steps of writing the first, second, third, fourth, fifth, and sixth data.

12. The method of claim 9, wherein the first datum has zeros in all of its bit positions and the second datum has ones in all of its bit positions.

13. The method of claim 9, wherein:

X is an integer and is the particular bit position having third and fourth tag locations and data as follows:

the third tag location is $2^{(X+1)}-1$;

the third datum is $2^{(X+1)}-(2^{(X-1)}+1)$;

the fourth tag location is $2^{(X+1)}$; and the fourth datum is $2^{(X+1)}+2^{(X-1)}$; and the fifth tag location has ones in all of its bit positions;

the fifth datum has ones in all of its bit positions except for the most significant bit position which is a one;

the sixth tag location has zeros in all of its bit positions; and the sixth datum has zeros in all of its bit positions except for the most significant bit position which is a zero.

14. The method of claim 9, wherein:

the plurality of bit positions includes N bit positions to be tested; and the steps of comparing are performed such that a total number of comparisons is at most 2N+2.

15. The method of claim 9, wherein the steps of writing and comparing are essentially the only steps of the method.

16. The method of claim 9, wherein:

except for the first particular bit position, each of the N bit positions of the third tag location has a same state as each of its corresponding bit position of the third datum; and except for the first particular bit position, each of the N bit positions of the fourth tag location has a same state as each of its corresponding bit position of the fourth datum.

* * * * *